(12) United States Patent
Park

(10) Patent No.: US 10,764,680 B2
(45) Date of Patent: Sep. 1, 2020

(54) MICROPHONE SYSTEM

(71) Applicant: ADTECH CO., LTD., Chungcheongbuk-do (KR)

(72) Inventor: Young Chul Park, Pyeongtaek-si (KR)

(73) Assignee: ALPHA HOLDINGS, INC., Cheongju-si, Chungcheongbuk-Do (KR)

( * ) Notice: Subject to any disclaimer, the term of this patent is extended or adjusted under 35 U.S.C. 154(b) by 0 days.

(21) Appl. No.: 16/327,345

(22) PCT Filed: May 29, 2017

(86) PCT No.: PCT/KR2017/005586
§ 371 (c)(1),
(2) Date: Feb. 22, 2019

(87) PCT Pub. No.: WO2018/038359
PCT Pub. Date: Mar. 1, 2018

(65) Prior Publication Data
US 2019/0191243 A1     Jun. 20, 2019

(30) Foreign Application Priority Data
Aug. 26, 2016 (KR) .......................... 10-2016-0108946

(51) Int. Cl.
*H04R 3/00* (2006.01)
*H04R 3/06* (2006.01)
(Continued)

(52) U.S. Cl.
CPC .............. *H04R 3/007* (2013.01); *H03F 1/26* (2013.01); *H03F 1/30* (2013.01); *H03F 3/187* (2013.01);
(Continued)

(58) Field of Classification Search
CPC . H04R 3/007; H04R 3/00; H04R 3/06; H04R 19/04; H04R 2201/003; H04R 2410/03
(Continued)

(56) References Cited

U.S. PATENT DOCUMENTS

2006/0008097 A1    1/2006  Stenberg et al.
2009/0003629 A1*   1/2009  Shajaan ................. H04R 1/005
                                                         381/113
(Continued)

FOREIGN PATENT DOCUMENTS

KR        10-1094397         12/2011
KR      10-2013-0116812      10/2013
(Continued)

OTHER PUBLICATIONS

International Search Report for International Application No. PCT/KR2017/005586, dated Aug. 28, 2017.
(Continued)

*Primary Examiner* — Disler Paul
(74) *Attorney, Agent, or Firm* — Kile Park Reed & Houtteman PLLC

(57) ABSTRACT

Provided is a microphone system insensitive to external noise, and the microphone system includes a microphone sensor that generates sensing data by sensing a change in sound pressure through a sensor bias voltage, a lead-out circuit that provides the sensor bias voltage for operating the microphone sensor, removes noise of the sensing data, and outputs the sensing data, a first pad that connects the microphone sensor and the lead-out circuit to each other and allows the sensor bias voltage to pass therethrough, and a second pad that connects the microphone sensor and the lead-out circuit to each other and allows the sensing data to pass therethrough.

15 Claims, 3 Drawing Sheets

(51) Int. Cl.
*H03F 1/30* (2006.01)
*H03F 1/26* (2006.01)
*H03F 3/187* (2006.01)
*H03F 3/21* (2006.01)
*H04R 19/04* (2006.01)

(52) U.S. Cl.
CPC ............... *H03F 3/211* (2013.01); *H04R 3/00* (2013.01); *H04R 3/06* (2013.01); *H04R 19/04* (2013.01); *H03F 2200/03* (2013.01); *H04R 2201/003* (2013.01); *H04R 2410/03* (2013.01)

(58) Field of Classification Search
USPC .................... 381/92, 111–113, 94.1, 94.7
See application file for complete search history.

(56) References Cited

U.S. PATENT DOCUMENTS

| | | | | |
|---|---|---|---|---|
| 2010/0166227 | A1* | 7/2010 | Pennock | H04R 19/005 381/111 |
| 2015/0131813 | A1* | 5/2015 | Kim | H03F 1/0266 381/119 |

FOREIGN PATENT DOCUMENTS

| KR | 10-2014-0036790 | 3/2014 |
|---|---|---|
| KR | 10-2015-0054214 | 5/2015 |

OTHER PUBLICATIONS

Written Opinion for International Application No. PCT/KR2017/005586 with English translation, dated Aug. 28, 2017.

\* cited by examiner

MICROPHONE SYSTEM

TECHNICAL FIELD

The present disclosure relates to a microphone system, and more particularly, to a microphone system insensitive to noise.

BACKGROUND ART

An audio microphone is commonly used in various consumer applications such as cellular phones, digital audio recorders, personal computers, and teleconferencing systems. Particularly, a low cost electret condenser microphone (ECM) is used in mass-produced cost-sensitive applications. The ECM microphone typically includes a film made of an electret material and mounted in a small package having a sound port and an electrical output terminal. The electret material is attached to a diaphragm or constitutes the diaphragm itself. As another type of microphone, there is a micro electro-mechanical system (MEMS) microphone and in this MEMS microphone, a pressure-sensitive diaphragm may be implemented on an integrated circuit.

Among them, the audio microphone used in communication devices requires immunity to radio frequency (RF) signals. A voice frequency band of the microphone is used in about 40 kHz or less, but a frequency band used for communication ranges from several hundreds of MHz to several GHz.

Such a high frequency communication carrier may be demodulated into a voice band by internal or external mechanisms or elements of the microphone. Therefore, the communication frequency has an influence on a voice frequency, so that the performance of the microphone is deteriorated.

Particularly, in the case of communication devices using a time division multiple access (TDMA) scheme, since a power amplifier periodically operates in accordance with a periodic transmission (Tx) operation of the communication devices, there is a problem that TDMA noise has an influence on the microphone. Accordingly, a microphone system insensitive to such external noise is required.

In general, in order to prevent external noise from being introduced into a microphone system, a low pass filter may be provided at the power supply VDD and output OUT of a microphone module. However, since such a filter is exposed to the outside of the microphone module and a capacitor for filtering is added to the outside of the microphone module, there is a problem that cost increases and productivity is reduced.

Furthermore, since the external noise may also be introduced through pads connected between a microphone sensor and an integrated circuit as well as the power supply VDD and output OUT of the microphone module, the noise introduced through such pads may not be filtered by a filter connected to the power supply VDD and output of the microphone module.

DISCLOSURE

Technical Problem

Various embodiments are directed to provide a microphone system insensitive to external noise.

Various embodiments are directed to reduce manufacturing cost and increase productivity by arranging a noise filter on an integrated circuit inside a microphone module.

Various embodiments are directed to provide a microphone system that filters external noise that is introduced through pads between a microphone sensor and an integrated circuit.

Technical Solution

In an embodiment, a microphone system includes a microphone sensor configured to generate sensing data by sensing a change in sound pressure through a sensor bias voltage; a read-out circuit configured to provide the sensor bias voltage for operating the microphone sensor, and receive and output the sensing data; a first pad configured to connect the microphone sensor and the read-out circuit to each other and allow the sensor bias voltage to pass therethrough; and a second pad configured to connect the microphone sensor and the read-out circuit to each other and allow the sensing data to pass therethrough, wherein the read-out circuit includes: a first filter unit configured to filter the sensor bias voltage and filter first noise introduced from the first pad; a second filter unit configured to filter second noise introduced from the second pad; and a voltage buffer configured to amplify the sensing data and discharge the first noise or the second noise.

In an embodiment, a microphone system includes a microphone sensor configured to generate sensing data by sensing a change in sound pressure through a sensor bias voltage; a read-out circuit configured to provide the sensor bias voltage for operating the microphone sensor, and receive and output the sensing data; a first pad configured to connect the microphone sensor and the read-out circuit to each other and allow the sensor bias voltage to pass therethrough; and a second pad configured to connect the microphone sensor and the read-out circuit to each other and allow the sensing data to pass therethrough, wherein the read-out circuit includes: a separation buffer configured to separate a voltage environment of the first pad and the second pad; a first filter unit configured to filter the sensor bias voltage and filter first noise introduced from the first pad; a second filter unit configured to filter second noise introduced from the second pad; and a voltage buffer configured to amplify the sensing data.

Advantageous Effects

The microphone system according to the present invention is insensitive to external noise and can sense an accurate value according to sound pressure.

Furthermore, the present invention has an effect of reducing manufacturing cost and increasing productivity by arranging a noise filter on an integrated circuit inside a microphone module.

Furthermore, the present invention can filter external noise that is introduced through pads between a microphone sensor and an integrated circuit.

MODE FOR DISCLOSURE

Figure 1:
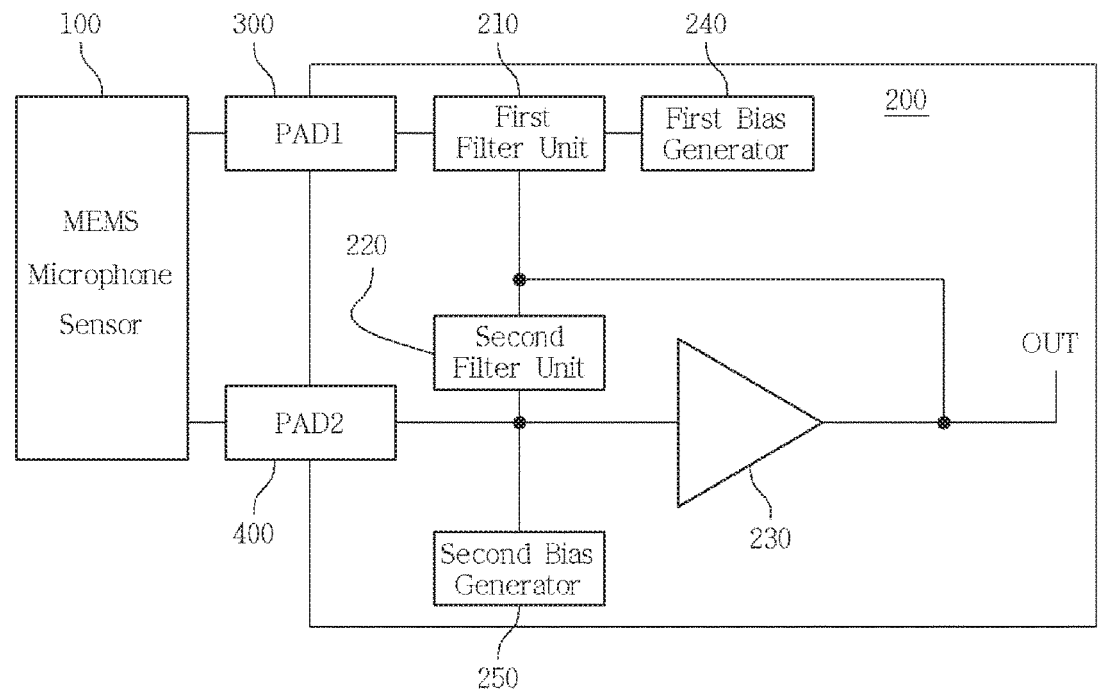
FIG. 1 is a diagram illustrating a microphone system according to an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

Since an embodiment described in the present specification and configurations illustrated in the drawings are preferred embodiments of the prevent invention and do not represent all the technical scopes of the prevent invention, there may be various equivalents and modification examples which can substitute for them at the time of application of the prevent invention.

FIG. 1 is a diagram illustrating a microphone system according to an embodiment of the present invention. Referring to FIG. 1, the microphone system according to the present invention includes a Microphone sensor 100, a read-out circuit 200, a PAD1 300, and a PAD2 400.

The Microphone sensor 100 generates sensing data by sensing a change in sound pressure through a sensor bias voltage. More specifically, the Microphone sensor 100 may generate the sensing data through a sensor embedded in the Microphone sensor 100 in correspondence to the sensor bias voltage introduced through the PAD1 300 to be described below.

The sensor bias voltage is a bias voltage for biasing the Microphone sensor 100, which is generated from a first bias generator 240 to be described below. The sensor bias voltage may have voltages with various magnitudes depending on the performance or environments of the microphone system.

The Microphone sensor 100 may include a sensor that receives sound waves or ultrasonic waves and generates sensing data based on the vacuum of the received sound waves or ultrasonic waves. As the sensor used in the Microphone sensor 100, various types of electronic sensors may be exemplified; however, in the present invention, capacitor type microphone sensors will be exemplified and among them, a MEMS microphone will be described as an example.

In the present invention, a case where the Microphone sensor 100 operates in a DC bias manner as a capacitor type sensor. The Microphone sensor 100 may not include electrode layers (not illustrated). Since an interval of such electrode layers may be changed according to sound pressure, the electrode layers may have characteristics of a variable capacitor in which its capacitance value is changed according to a change in an interval of electrode layers.

For example, in a state in which a sensor bias voltage has been applied to the Microphone sensor 100, there is a change in sound pressure, resulting in a change in the capacitance value of the Microphone sensor 100. Thus, sensing data of the Microphone sensor 100 changes. The sensing data is provided to the read-out circuit 200 through the PAD2 400 to be described below.

The read-out circuit 200 may provide the sensor bias voltage for operating the Microphone sensor 100, remove noise of the sensing data, and output the sensing data to an exterior.

The read-out circuit 200 may further include an input pad (not illustrated) for receiving an operating voltage VDD from an exterior or an output pad (not illustrated) for outputting the sensing data generated in the Microphone sensor 100 to an exterior.

Detailed operation and configuration of the read-out circuit 200 will be described below. The PAD1 300 may transfer the sensor bias voltage provided by the read-out circuit 200 to the Microphone sensor 100, and the PAD2 400 may provide the read-out circuit 200 with the sensing data provided by the Microphone sensor 100.

The PAD1 300 and the PAD2 400 are positioned between the read-out circuit 200 and the Microphone sensor 100, and may be provided in the form of a pin for physically connecting the read-out circuit 200 and the Microphone sensor 100 to each other.

Since such PAD1 300 and PAD2 400 physically connect the read-out circuit 200 and the Microphone sensor 100 to each other, they may be exposed to the outside of an integrated circuit or the microphone sensor and may be vulnerable to external noise such as radio frequency (RF) noise in a microphone system used in a communication device. Particularly, when a communication device operates in a TDMA mode, TDMA noise generated due to the characteristics of the TDMA mode may be introduced to the PAD1 300 or the PAD2 400.

In the present invention, for the purpose of convenience, noise introduced through the PAD1 300 will be referred to as first noise and noise introduced through the PAD2 400 will be referred to as second noise.

The read-out circuit 200 may include a first filter unit 210, a second filter unit 220, a voltage buffer 230, a first bias generator 240, and a second bias generator 250. The elements included in the read-out circuit 200 may be integrated on the read-out circuit 200 as one chip.

The first filter unit 210 may filter a sensor bias voltage generated in the first bias generator 240 to be described below, and filter the first noise introduced from the PAD1 300. To this end, the first filter unit 210 may be connected between the PAD1 300 and the first bias generator 240.

A first filter CF1 of the first filter unit 210 filters the first noise introduced to the inside of the read-out circuit 200 through the PAD1 300.

The second filter unit 220 filters the second noise introduced to the inside of the read-out circuit 200 through the PAD2 400.

The voltage buffer 230 amplifies sensing data and discharges the first noise or the second noise.

The first bias generator 240 provides the sensor bias voltage by pumping a change amount with respect to a reference voltage generated in the read-out circuit 200 by using a power supply voltage received from an exterior.

The second bias generator 250 provides a buffer bias voltage for biasing the voltage buffer 230 through a reference current or a reference voltage generated in the read-out circuit 200 by using a power supply voltage provided from an exterior. In order to minimize the introduction of sensing data provided through the PAD2 400 to the second bias generator 250 or a leakage current from the capacitive Microphone sensor 100, the second bias generator 250 may include a high impedance circuit.

Figure 2:
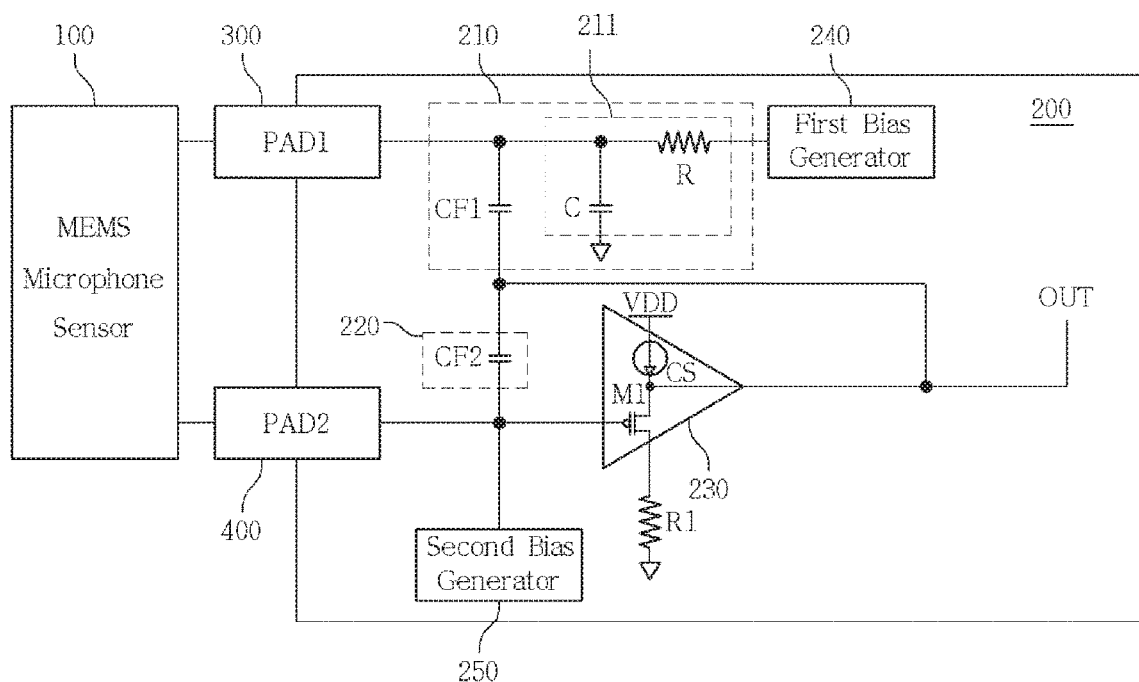
FIG. 2 is a detailed diagram illustrating an embodiment of FIG. 1.

With reference to FIG. 2, more details will be described. FIG. 2 is a detailed diagram illustrating the embodiment of FIG. 1. In FIG. 2, a description of elements overlapping those of FIG. 1 and functions thereof will be omitted.

Referring to FIG. 2, the first filter unit 210 may include the first filter CF1 including a resistor or a capacitor in which one end is connected to an output terminal of the voltage buffer 230 and the second filter unit 220 and the other end is connected to the PAD1 300, and a low pass filter 211 connected between the other end of the first filter CF1 and the first bias generator 240.

The low pass filter 211 performs a filtering function on the sensor bias voltage including a large amount of noise due to the pumping of the charge amount by the first bias generator 240 to be described below, and transfers the filtered sensor bias voltage to the Microphone sensor 100 through the PAD1 300. To this end, the low pass filter 211 may have a configuration for allowing only a low frequency to pass therethrough with respect to the bias voltage provided by the first bias generator 240, and the RC circuit illustrated in FIG. 2 may be representatively exemplified.

The second filter unit 220 may include a second filter CF2 in order to filter the second noise introduced from the PAD2 400.

The second filter CF2 may include a capacitor in which one end is connected to the output terminal of the voltage buffer 230 and the first filter unit 210 and the other end is connected to the PAD2 400 and an input terminal of the voltage buffer 230.

The first filter CF1 and the second filter CF2 may be connected to each other, and the output terminal of the voltage buffer 230 to be described below may be connected to a line through which the first filter CF1 and the second filter CF2 are connected to each other. The output terminal of the voltage buffer 230 has a low impedance, resulting in the formation of a path through which the first noise and the second noise having a high frequency may flow to the voltage buffer 230 through the first filter CF1 or the second filter CF2.

That is, the first filter CF1 may filter the first noise by forming a path through which the first noise introduced from the PAD1 300 and having a high frequency component may pass, and the second filter CF2 may filter the second noise by forming a path through which the second noise introduced from the PAD2 400 and having a high frequency component may pass.

The first filter CF1 may include a resistor or a capacitor in order to filter the first noise, and in such a case, a resistance value or a capacitance value of the first filter CF1 may be flexibly set by a designer according to the microphone system or noise environments. FIG. 2 illustrates a case where the first filter CF1 includes the capacitor.

Accordingly, even though the first noise is introduced to the read-out circuit 200 through the PAD1 300, the first noise is directly discharged to an exterior through the first filter CF1 of the first filter unit 210 and the output terminal of the voltage buffer 230. Consequently, the first noise of a high frequency is filtered before being demodulated in the read-out circuit 200 and having an influence on a voice signal, so that it is possible to prevent the sensing function of the microphone system from deteriorating due to external noise.

Preferably, the second filter CF2 includes a capacitor in order to filter the second noise and operate as an open circuit for the low frequency sensing data provided through the Microphone sensor 100. When the second filter CF2 includes the capacitor, sensing data as voice data having low frequency characteristics can be amplified by directly flowing to the voltage buffer 230 by the second filter CF2.

That is, even though the second noise and the sensing data are introduced from the PAD2 400 in the same way, they have paths different from each other according to frequency bands, so that the second noise can be filtered.

In such a case, the capacitance value of the second filter CF2 may be flexibly set by a designer according to the microphone system or noise environments.

Accordingly, even though the second noise is introduced to the read-out circuit 200 through the PAD2 400, the second noise is directly discharged to an exterior through the second filter CF2 and the output terminal of the voltage buffer 230. Consequently, the second noise of a high frequency is filtered before being demodulated in the read-out circuit 200 and having an influence on a voice signal, so that it is possible to prevent the sensing function of the microphone system from deteriorating due to external noise.

The read-out circuit 200 may further include a control unit (not illustrated) for controlling a time constant of the first filter CF1 included in the first filter unit 210 according to a signal feedback $_{[KP1]}$ from the voltage buffer 230. The control unit (not illustrated) is connected to the voltage buffer 230 and the first filter unit 210 and adjusts the capacitance value of the first filter CF1 in correspondence to the output of the voltage buffer 230, so that it is possible to improve the signal-to-noise ratio (SNR) of the read-out circuit 200.

The voltage buffer 230 may amplify the sensing data provided from the Microphone sensor 100 and discharge the first noise or the second noise.

The voltage buffer 230 may function as a buffer serving as a source follower having a voltage gain of 1 or less with respect to the sensing data provided from the Microphone sensor 100 through the PAD2 400, thereby amplifying the sensing data and providing the amplified sensing data to an exterior.

The input terminal of the voltage buffer 230 is connected to the PAD2 400 and the second filter unit 220 and receives the sensing data. The output terminal of the voltage buffer 230 is connected to the output terminal of the read-out circuit 200, the first filter unit 210, and the second filter unit 220 and provides the amplified sensing data to an exterior OUT, or receives the first noise or the second noise and discharges the first noise or the second noise through a ground terminal.

Since the voltage buffer 230 has a characteristic in which an input impedance is high and an output impedance is very low, the first noise and the second noise having passed through the second filter unit 220 are introduced into the output terminal of the voltage buffer 230 without flowing to the exterior OUT and are discharged to the ground terminal of the voltage buffer 230.

In order to perform the aforementioned functions, the voltage buffer 230 may include a current source CS, which provides a current of a predetermined magnitude in correspondence to the operating voltage VDD, and a transistor M1 that is connected to the second filter unit 220 and discharges the first noise or the second noise.

The current source CS receives the operating voltage VDD for performing an amplification function for the sensing data of the voltage buffer 230, and provides the operating voltage VDD to the inside of the voltage buffer 230 with a predetermined current.

The transistor M1 amplifies the sensing data that is inputted from the input terminal of the voltage buffer 230, and discharges the first noise or the second noise, which is inputted from the output terminal of the voltage buffer 230, to the ground terminal. To this end, the transistor M1 may include a PMOS transistor in which a gate is connected to the second filter unit 220 and the PAD2 400, a drain is connected to the ground terminal, and a source is connected to the current source CS.

Figure 3:
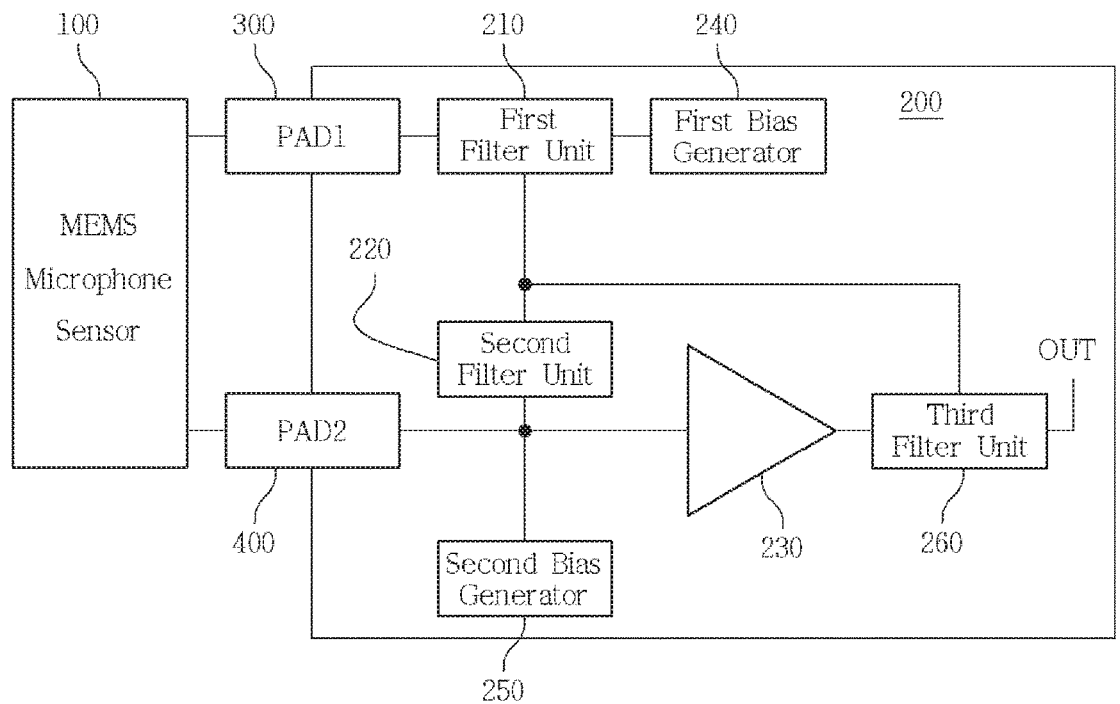
FIG. 3 is a diagram illustrating a microphone system according to another embodiment of the present invention.

FIG. 3 is a diagram illustrating a microphone system according to another embodiment of the present invention.

In FIG. 3, a description of elements overlapping those of FIG. 1 and FIG. 2 and functions thereof will be omitted.

Figure 4:
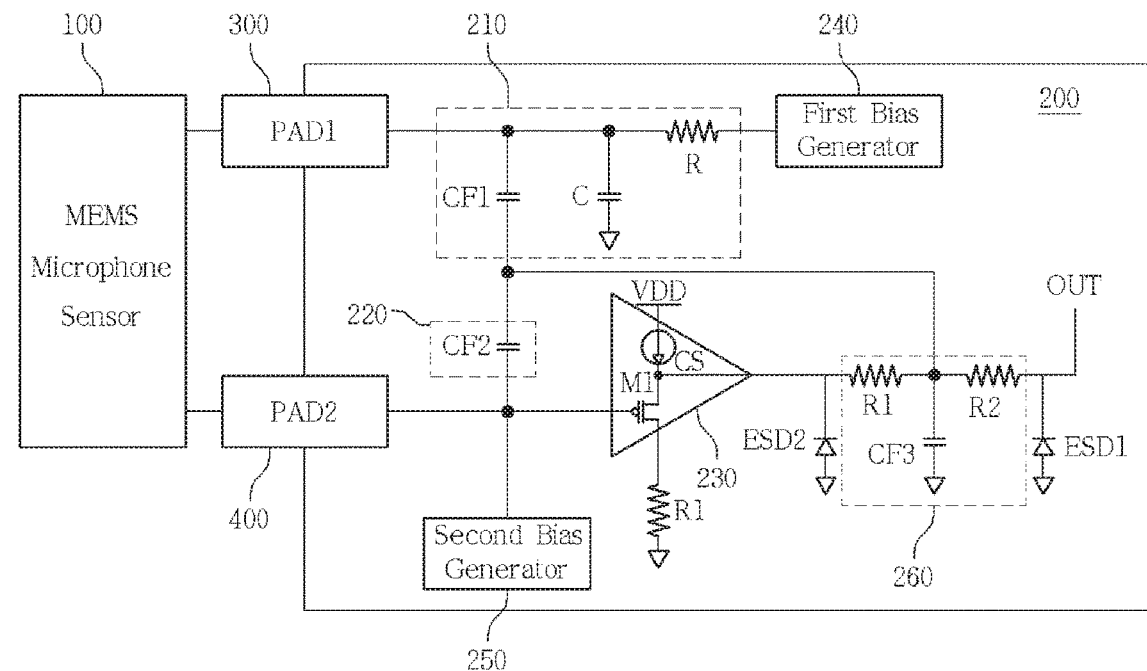
FIG. 4 is a detailed diagram illustrating an embodiment of FIG. 3.

FIG. 4 is a detailed diagram illustrating the embodiment of FIG. 3. Referring to FIG. 3 and FIG. 4, it can be understood that a third filter unit 260 is further provided, differently from the embodiment of FIG. 1. The third filter unit 260 filters again the first noise filtered through the first filter unit 210 or the second noise filtered through the second filter unit 220.

More specifically, the third filter unit 260 may include a third filter CF3 in which one end is grounded and the other end is connected to the first filter unit 210 and the second filter unit 220, a first resistor R1 disposed between the other end of the third filter CF3 and the voltage buffer 230, and a second resistor R2 connected to the other end of the third filter CF3 and the output terminal of the read-out circuit 200.

The third filter unit 260 filters high frequency noise, which passes through the first filter unit 210 or the second filter unit 220, or high frequency noise, which is outputted from the voltage buffer 230, through the third filter CF3 and the resistors R1 and R2.

In order to minimize demodulation of high frequency noise due to PN coupling of electrostatic discharge prevention circuits ESD1 and ESD2 connected to the output terminal of the read-out circuit 200, the ESD1 and the ESD2 are separately disposed with respect to the third filter unit 260.

Figure 5:
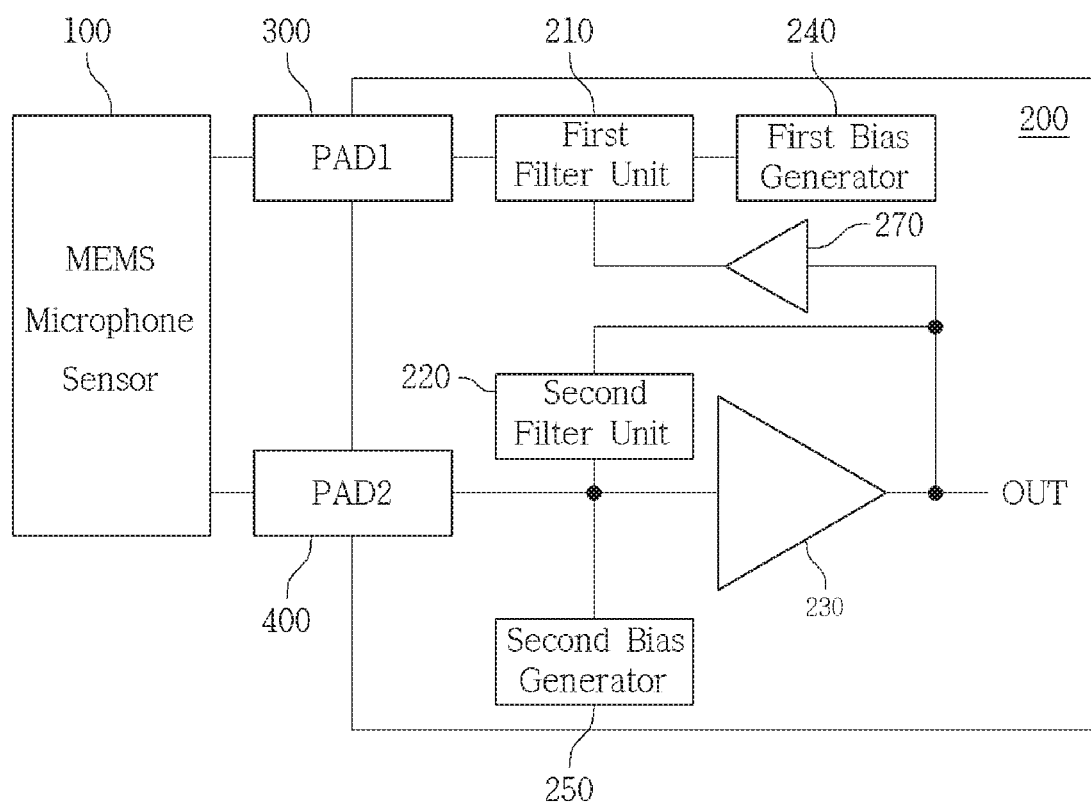
FIG. 5 is a diagram illustrating a microphone system according to further another embodiment of the present invention.

FIG. 5 is a diagram illustrating a microphone system according to further another embodiment of the present invention. In FIG. 5, a description of elements overlapping those of FIG. 1 and FIG. 2 and functions thereof will be omitted.

Referring to FIG. 5, the first filter unit 210 and the second filter unit 220 may be separately provided and a separation buffer 270 may be further provided.

In the microphone systems according to the embodiments of FIG. 1 and FIG. 2, the path through which the first noise introduced from the PAD1 300 flows and the path through which the second noise introduced from the PAD2 400 flows follow the same line in the process of flowing to the input terminal of the voltage buffer 230. Therefore, in a process in which the first filter unit 210 or the second filter unit 220 performs filtering, interference may be caused by connected other pads or filters.

In order to achieve more improved characteristics for the interference due to each pad or each filter, in the embodiment of FIG. 5, the first filter unit 210 for filtering the first noise and the second filter unit 220 for filtering the second noise are separated from each other without being directly connected to each other and the separation buffer 270 may be disposed between the first filter unit 210 and the second filter unit 220 in order to separate a voltage environment between the first filter unit 210 and the second filter unit 220.

More specifically, an input terminal of the separation buffer 270 may be connected to the output terminal of the voltage buffer 230 and the second filter unit 220 and an output terminal of the separation buffer 270 may be connected to the first filter unit 210.

In the separation buffer 270, the output terminal with a low impedance may be connected to the first filter unit 210 and the input terminal with a high impedance may be connected to the second filter unit 220 in order to prevent interference between the PAD1 300 and the PAD2 400. Therefore, the first noise filtered through the first filter unit 210 is introduced to the separation buffer 270 through the output terminal with a low impedance of the separation buffer 270, but the second noise filtered through the second filter unit 220 is not introduced to the separation buffer 270 by the input terminal with a high impedance of the separation buffer 270 and flows to the output terminal of the voltage buffer 230.

Accordingly, the separation buffer 270 may be implemented in various forms having a structure in which input impedance is high and output impedance is low, and a voltage gain may be 1 or more. Furthermore, the separation buffer 270 may include a transistor for discharging introduced noise to an exterior similarly to the voltage buffer 230.

The first filter unit 210 and the second filter unit 220 can perform filtering by the separation buffer 270 without being interfered by noise provided from different pads, so that the filtering function of the microphone system is enhanced.

While various embodiments have been described above, it will be understood to those skilled in the art that the embodiments described are by way of example only. Accordingly, the disclosure described herein should not be limited based on the described embodiments.

The invention claimed is:

1. A microphone system comprising:
   a microphone sensor configured to generate sensing data by sensing a change in sound pressure through a sensor bias voltage;
   a read-out circuit configured to provide the sensor bias voltage for operating the microphone sensor, and receive and output the sensing data;
   a first pad configured to connect the microphone sensor and the read-out circuit to each other and allow the sensor bias voltage to pass therethrough; and
   a second pad configured to connect the microphone sensor and the read-out circuit to each other and allow the sensing data to pass therethrough,
   wherein the read-out circuit comprises:
   a first filter unit configured to filter the sensor bias voltage and filter first noise introduced from the first pad;
   a second filter unit configured to filter second noise introduced from the second pad; and
   a voltage buffer configured to amplify the sensing data and discharge the first noise or the second noise;
   wherein the read-out circuit further comprises:
   a first bias generator configured to generate the sensor bias voltage by amplifying a reference voltage; and
   a second bias generator configured to provide the voltage buffer with a buffer bias voltage by using a reference current, and
   wherein the first filter unit comprises:
   a first filter including a resistor or a capacitor in which one end is connected to an output terminal of the voltage buffer and the second filter unit and the other end is connected to the first pad; and
   a low pass filter configured to be connected between the other end of the first filter and the first bias generator.

2. The microphone system according to claim 1, wherein the first filter unit is connected to the first pad and the first bias generator.

3. The microphone system according to claim 1, wherein the first filter filters the first noise, and the low pass filter filters the sensor bias voltage.

4. The microphone system according to claim 1, wherein the second filter unit includes a second filter including a capacitor in which one end is connected to an output terminal of the voltage buffer and the first filter unit and the other end is connected to the second pad and an input terminal of the voltage buffer.

5. The microphone system according to claim 1, wherein an input terminal of the voltage buffer is connected to the second pad and the second filter unit, and an output terminal of the voltage buffer is connected to the first filter unit, the second filter unit, and an output terminal of the read-out circuit.

6. The microphone system according to claim 1, wherein the voltage buffer comprises:
   a current source configured to provide a current of a predetermined magnitude in correspondence to an operating voltage; and
   a transistor configured to discharge the first noise or the second noise.

7. The microphone system according to claim 6, wherein the transistor includes a PMOS transistor.

8. The microphone system according to claim 6, wherein the transistor includes a gate connected to the second filter unit and the second pad, a drain connected to a ground terminal to which the first noise or the second noise is discharged, and a source connected to the current source.

9. The microphone system according to claim 1, wherein the voltage buffer includes a source follower having a voltage gain of 1 or less.

10. The microphone system according to claim 1, further comprising:
    a third filter unit configured to filter again the first noise filtered through the first filter unit or the second noise filtered through the second filter unit.

11. The microphone system according to claim 10, wherein the third filter unit comprises:
    a third filter in which one end is grounded and the other end is connected to the first filter unit and the second filter unit;
    a first resistor connected between the other end of the third filter and the voltage buffer; and
    a second resistor connected to the other end of the third filter and an output terminal of the read-out circuit.

12. A microphone system comprising:
    a microphone sensor configured to generate sensing data by sensing a change in sound pressure through a sensor bias voltage;
    a read-out circuit configured to provide the sensor bias voltage for operating the microphone sensor, and receive and output the sensing data;
    a first pad configured to connect the microphone sensor and the read-out circuit to each other and allow the sensor bias voltage to pass therethrough; and
    a second pad configured to connect the microphone sensor and the read-out circuit to each other and allow the sensing data to pass therethrough,
    wherein the read-out circuit comprises:
    a separation buffer configured to separate a voltage environment of the first pad and the second pad;
    a first filter unit configured to filter the sensor bias voltage and filter first noise introduced from the first pad;
    a second filter unit configured to filter second noise introduced from the second pad; and
    a voltage buffer configured to amplify the sensing data;
    wherein the separation buffer discharges the filtered first noise, and the voltage buffer discharges the filtered second noise.

13. The microphone system according to claim 12, wherein an input terminal of the separation buffer is connected to an output terminal of the voltage buffer and the second filter unit, and an output terminal of the separation buffer is connected to the first filter unit.

14. The microphone system according to claim 12, wherein the first filter unit is connected to the first pad and an input terminal of the separation buffer.

15. The microphone system according to claim 12, wherein the second filter unit has one end connected to the separation buffer and an output terminal of the voltage buffer and the other end connected to the second pad and an input terminal of the voltage buffer.

* * * * *